(12) United States Patent
Buckley

(10) Patent No.: US 6,480,006 B1
(45) Date of Patent: *Nov. 12, 2002

(54) METHOD FOR MEASURING PHASE NOISE USING A LOW NOISE SYNTHESIZER

(75) Inventor: Robert Matthew Buckley, Medford, NY (US)

(73) Assignee: Advanced Testing Technologies Inc., Hauppauge, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/562,563

(22) Filed: May 2, 2000

Related U.S. Application Data

(63) Continuation of application No. 09/007,254, filed on Jan. 14, 1998, now Pat. No. 6,057,690.

(51) Int. Cl.[7] .......................... G01R 27/00; H04B 17/00
(52) U.S. Cl. .................. 324/613; 324/76.23; 455/67.3; 455/67.6
(58) Field of Search .............................. 324/613, 76.23; 455/67.3, 67.6

(56) References Cited

U.S. PATENT DOCUMENTS

| | | | |
|---|---|---|---|
| 4,748,399 A | 5/1988 | Caldwell | 324/613 |
| 5,053,714 A | 10/1991 | Durand | 324/613 |
| 5,179,344 A | 1/1993 | Najle et al. | 324/613 |
| 5,337,014 A | 8/1994 | Najle et al. | 324/613 |
| 5,412,325 A | 5/1995 | Meyers | 324/613 |
| 5,508,661 A | 4/1996 | Keane et al. | 331/37 |
| 5,608,331 A | 3/1997 | Newberg et al. | 324/613 |
| 5,770,977 A | 6/1998 | Uurtamo | 33/140 |
| 6,057,690 A | * 5/2000 | Buckley | 324/613 |

* cited by examiner

*Primary Examiner*—N. Le
*Assistant Examiner*—Anjan K. Deb
(74) *Attorney, Agent, or Firm*—Brian Roffe

(57) ABSTRACT

A phase noise measurement method including a low noise programmable synthesizer and a receiver/down converter is provided. The low noise synthesizer provides L-Band Signals which can selectively exhibit low noise close-in or low noise far out. The receiver/down converter provides for absolute, additive, and down converted/direct/multiple phase noise measurement.

15 Claims, 6 Drawing Sheets

METHOD FOR MEASURING PHASE NOISE USING A LOW NOISE SYNTHESIZER

CROSS-REFERENCE TO RELATED APPLICATIONS

This application is a continuation of U.S. patent application Ser. No. 09/007,254 filed Jan. 14, 1998, now U.S. Pat. No. 6,057,690.

This application is also related to U.S. patent application Ser. No. 09/007,255 filed Jan. 14, 1998, now U.S. Pat. No. 5,952,834.

FIELD OF THE INVENTION

The present invention relates to the field of automatic test equipment for testing electronic signals, and more particularly, to automatic test equipment for analyzing the noise component of an electronic signal.

BACKGROUND OF THE INVENTION

Automatic test equipment for testing the performance of communications systems, radar systems, and other signal producing devices are known. In this regard, it is often necessary to evaluate the spectral purity of a signal produced by a unit under test (UUT) in order to determine if the UUT is operating within the manufacturer's or end user's specifications. Specifically, a manufacturer or end user may specify the maximum phase noise which may be present on a signal produced by the UUT. The phase noise of a signal is a measure of the random phase instability of the signal.

The phase noise of a UUT can be measured in a variety of ways. For example, the output signal of the UUT can be applied directly into the input of a spectrum analyzer which will display the power spectral density of the signal and the phase noise will be visible in the display as random noise power in the spectral plot. Alternatively, the phase noise can be measured using a second signal source as a reference. The second signal source outputs a signal which is identical to or better than the expected UUT signal, but in phase quadrature (if phase modulation noise is being tested) to the UUT signal, i.e., the second signal source is at the same frequency as the UUT signal, but is phase shifted by 90 degrees. The UUT and the second signal source are input into a mixer and, since the two signals have the same carrier frequency, the signals cancel each other out, leaving a signal comprising the combined phase noise of the UUT and the second signal source. In addition, the phase noise may be measured using the Down Converter/Multiple Direct Spectrum Measurement Technique, which is described in U.S. Pat. Nos. 5,337,014 and 5,179,344, the specifications of which are hereby incorporated by reference herein.

Conventionally, when a UUT signal is analyzed, the technician uses a variety of discrete components including a programmable down converter for translating the input signal into a lower, and more easily analyzed, frequency; a narrow FM tunable synthesizer for generating a reference signal, and a separate spectrum analyzer. Since each of these components has its own unique programming requirements, significant time and effort is often spent programming and integrating these discrete components into an effective phase noise measurement system.

With respect to prior art, U.S. Pat. No. 5,508,661 (Keane et al.) describes a fast tuning YIG frequency synthesizer using a fixed oscillator driving a comb line generator to generate a spectrum of comb lines, one of which is selected by a switched array of fixed-tuned, YIG passband filters. The selected comb line is combined in a mixer with a signal from a local oscillator, which, preferably, is a direct digital synthesizer. The output of the mixer is fed to another switched array of fixed-tuned YIG passband filters where only the desired sideband is selected and the comb line and the other sideband is filtered out. In various alternative embodiments, tunable YIG filters are substituted for each array. Some embodiments also use a reverse slope equalizer to break up the coherent energy in the comb line spectrum at the output of the comb line generator to allow RF amplification to be applied without saturating the amplifier.

U.S. Pat. No. 5,770,977 (Uurtamo) describes a microwave frequency synthesizer with ultra-fast frequency settling and very high frequency resolution. The synthesizer purportedly provides the ability to achieve ultra-fast frequency settling times with good frequency resolution and high absolute accuracy over significant bandwidth at microwave frequencies ranging over three octaves. The implementation is an open-loop system requiring little or no compensation of temperature. This is accomplished by providing a frequency doubled direct digital synthesizer output to up/down convert a microwave frequency source. A special tracking filter architecture coupled to the microwave source provides the suppression of unwanted products. Fixed frequency set-on and swept bandwidths in excess of 300 MHz have been demonstrated. This is accomplished by using a direct digitally synthesized quadrature phased carrier which can be set to any frequency within a 350 MHz bandwidth to coherently up/down convert a low phase-noise microwave frequency to the sum or the difference frequency product. Individual control of differential phase and amplitude over frequency assures very high suppression of unwanted products without the use of additional filtering.

U.S. Pat. No. 5,053,714 (Durand) describes a measuring circuit for the additive phase noise characteristic of a component in the vicinity of a carrier frequency. The measuring circuit is constructed of a central channel and two side channels. Each of these channels contains a model of the component to be characterized. Two phase detecting circuits are employed in which each processes an input signal from one of the side channels with an input signal from the central channel to generate signals which represent phase deviations between the two input signals. An intercorrelation circuit then utilizes the outputs from these phase detecting circuits to determine the characteristic additive phase noise of the component to be characterized by eliminating any additive phase noise superadded by other measuring circuit elements or induced by outside disturbances.

U.S. Pat. No. 5,412,325 (Meyers) describes a phase noise measurement system and method in which three independent signal sources are used to statistically derive the power spectral density of the phase noise content of signals from each of them. This is accomplished by mixing each of the signals two at a time (i.e., signal one with signal two, signal one with signal three, and signal two with signal three) and capturing the resultant difference signals, such as with a waveform recorder, for example. A servo electronics loop is used to remove the carrier and any long term signal drift from the resultant difference signals. Statistical analysis is then used to compute the composite power spectral densities of the resultant difference signals, and to solve for the individual power spectral densities of the original signals. The system and method uses the mathematical relationships between the three sources that have similar magnitudes of phase noise, to compute the power spectral density of the noise content of signals from each source. The system and method purportedly requires a minimum of interconnect hardware and only three inexpensive waveform recorders. Furthermore, the size, weight, and cost of producing the present phase noise test system is said to be relatively low.

U.S. Pat. No. 5,608,331 (Newberg et al.) describes a noise measurement test system for making phase noise and amplitude noise measurements of microwave signals derived from a continuous wave RF source. The system comprises an RF input for receiving an applied RF noise signal and an RF coupler coupled to the RF input for splitting the applied RF noise signal into first and second paths. A mixer that comprises a synchronous phase detector is coupled to receive signals from the first and second paths and which outputs demodulated phase noise. The first path comprises a variable attenuator and a variable phase shifter coupled between the coupler and the first input of the mixer for providing a reference signal input to the synchronous detector. The second path comprises a delay line and an adjustable RF carrier nulling circuit coupled between the coupler and the mixer. A video amplifier is coupled to an output of the mixer for providing a baseband video output signal from the system that is processed to produce noise data.

U.S. Pat. No. 4,748,399 (Caldwell et al.) describes a multichannel phase noise measurement system which is purportedly capable of measuring the phase noise of two signal source operating between 100 MHz and 24 GHz. The system has two input channels and a mixer which produces a difference frequency between the signals received in the input channels. The difference frequency containing the phase noise is frequency multiplied and amplified to raise the phase noise level 12 dB. The multiplied and amplified difference signal is phase locked to a commercially available frequency synthesizer with inferior noise characteristics to the units being tested. By amplifying the phase noise of the original signals above the phase noise levels of the commercially available frequency synthesizer, they become measurable.

SUMMARY OF THE INVENTION

In accordance with the present invention, an integrated phase noise measurement system is provided which includes a low noise synthesizer module, a receiver/downconverter module, a controller, a digitizer, and a spectrum analyzer. The low noise synthesizer and receiver/downconverter may be used separately, or in combination with one another.

The low noise synthesizer module may be used in a phase noise measurement system to produce, for example, spectrally pure L-Band signals. In phase noise measurement systems, it is important that the synthesizer module, which provides the reference signal to which the UUT is compared, produces an extremely low noise signal. This is important because the phase noise measurement system will be unable to accurately measure noise in the signal produced by the UUT which is below the noise level of the synthesizer. As a result, the noise level of the synthesizer sets a "noise floor" below which noise measurements cannot be made. In addition, it is sometimes desirable to measure the noise of a signal "far out" as well as "close-in" from the carrier frequency of the UUT. Conventional low noise synthesizers, however, are normally unable to provide a reference signal which exhibits low noise both "far out" as well as "close-in" from the carrier frequency.

In accordance with the present invention, a low noise synthesizer is provided which produces an output signal with a low (phase and amplitude) noise characteristic close in to the carrier frequency, as well as low noise far out from the carrier frequency, by utilizing a low noise oscillator coupled to a comb generator to provide a signal with low noise close in, and a signal acoustic wave oscillator to provide a signal with low noise far out. The low noise synthesizer includes a low noise crystal oscillator for producing a signal having a frequency (preferably 120 MHz), and a surface acoustic wave oscillator for producing a signal having a second frequency (preferably 960 MHz). A comb generator is coupled to an output of the crystal oscillator, and a bandpass filter is coupled to the output of the comb generator. The bandpass filter has a passband which includes the second frequency (and preferably has a passband centered at 960 MHz). A frequency dividing component is coupled to the low noise crystal oscillator to selectively produce one of a plurality of offset frequencies, each of the plurality of offset frequencies being in a first frequency range (which is preferably from 10–40 MHz). A mixer has a first input coupled to an output of the frequency dividing component, and has a second input which is selectively coupled to either the output of the surface acoustic wave oscillator or the output of the bandpass filter. A tunable bandpass filter is coupled to an output of the mixer, and is selectively tuned to a passband which includes a sum (or difference) of the selected offset frequency and the second frequency. The output of the tunable bandpass filter provides an output signal with low noise close in when the output of the bandpass filter is coupled to the mixer, and an output signal with low noise far out when the surface acoustic wave oscillator is coupled to the mixer.

In accordance with the preferred embodiment of the low noise synthesizer, an low noise oscillator produces a 120 MHz reference signal which is multiplied to 960 MHz by a comb generator to provide a signal with low noise close in, (e.g., within 400 kHz of the carrier frequency) while a surface acoustic wave oscillator is utilized to produce a 960 MHz signal to provide a signal with low noise far out (e.g., >carrier frequency+400 kHz, <carrier frequency−400 kHz) but relatively high noise within 400 kHz of the carrier frequency. In accordance with this preferred construction, a noise component of less than 100 dBc is achieved at 100 Hz, <120 dBc is achieved at 1 kHz, <130 dBc is achieved at 10 kHz, <140 dBc is achieved at 100 kHz and <160 dBc is achieved at >=400 kHz.

The receiver/downconverter in accordance with the present invention is preferably used in conjunction with the low noise synthesizer described above, but may also be used with conventional synthesizers. In accordance with the present invention, the receiver/downconverter can be used to perform absolute phase noise measurement, additive phase noise measurement, and down converter/multiple direct (DND) phase noise measurement.

The receiver/downconverter includes a UUT input, a synthesizer input, an output, a first mixer, a second mixer, a delay element coupled to a first phase shifter, a phase locked loop (PLL) coupled to a second phase shifter, a first bandpass filter, a second band pass filter, a first low pass filter, a second low pass filter, a comb generator, and an amplifier. The synthesizer input is coupled to one input of the first mixer. The UUT input is coupled directly through to the other input of the first mixer for absolute phase noise measurement, and for DMD phase noise measurement. For an additive phase noise measurement, the UUT input is coupled through the delay element and first phase shifter before being applied to the other input of the first mixer. The output of the first mixer is selectively coupled to one of the first bandpass filter, the second bandpass filter, and the first low pass filter. The output of the second bandpass filter is coupled to the comb generator, and the output of the first bandpass filter is coupled to the PLL and to one input of the second mixer. The PLL is coupled to the second phase shifter, which, in turn, is coupled to the second input of the second mixer. The output of the second mixer is coupled to the second low pass filter. Finally, the outputs of the first low pass filter, the second lowpass filter, and the comb filter, are selectively coupled to the amplifier. The amplifier is coupled to the output of the receiver/downconverter.

In order to perform an absolute phase noise measurement with the receiver/downconverter, a synthesizer signal is generated by the synthesizer which is offset by a first offset frequency (preferably 10 MHz) from the expected UUT signal frequency. The synthesizer signal and the UUT signal are applied to the first mixer to generate an IF signal (preferably 10 MHz IF), which is then coupled through to the first bandpass filter (10 MHz BP for 10 MHz IF signal) to isolate the IF signal. The IF signal is then coupled to both i) the input of the PLL, and ii) one input of the second mixer. The output of the PLL is then passed through the second phase shifter prior to being applied to the other input of the second mixer. The PLL-Phase shifter circuit maintains phase quadrature between the two inputs of the second mixer. Since the two inputs to the second mixer have the same frequency, the mixer will output a 0 MHz difference signal to the second low pass filter (preferably 1.9 MHz low pass). The signal output from the second low pass filter, which comprises the absolute noise signal, is then passed through to the amplifier and then output to a spectrum analyzer via the output of the receiver/downconverter.

In order to perform an additive phase noise measurement with the receiver/downconverter, a synthesizer signal is generated by the synthesizer which is equal in frequency to the expected UUT signal. The UUT signal is passed through the delay line and the first phase shifter before being applied to one input of the first mixer. The first phase shifter maintains phase quadrature between the two inputs to the first mixer. Since the signals input to the first mixer are of equal frequency, the first mixer will output a 0 MHz difference signal to the first low pass filter (preferably 1.9 MHz low pass). The signal output from the second low pass filter, which comprises the additive phase noise signal, is then passed through to the amplifier, and output to the spectrum analyzer via the output of the receiver/downconverter.

In order to use the receiver/downconverter to down convert and multiply the UUT signal to microwave frequencies (DMD phase noise measurement) which can be directly measured on a spectrum analyzer as a double side band signal, a synthesizer signal is generated by the synthesizer which is offset by a second offset frequency (preferably 100 MHz) from the expected UUT signal frequency. The synthesizer signal and the UUT signal are applied to the first mixer to generate a second IF signal (preferably 100 MHz IF), which is then coupled through the third bandpass filter (preferably 100 MHz), and into the comb generator. As one of ordinary skill in the art will appreciate, the comb generator produces a spectrum of signals which are multiples of the input frequency signal. The output of the comb generator is then passed through the amplifier and on to the spectrum analyzer. The user can then choose which multiple of the second IF frequency he or she wishes to view. Preferably, a signal in the 4–6 GHz range is chosen because that is the most effective range of most spectrum analyzers.

In accordance with another embodiment of the present invention, the receiver/downconverter and the low noise synthesizer are incorporated into an integrated phase noise measurement system including a spectrum analyzer, a digitizer, and a controller. The controller may include, for example, a computer, a display screen, and a keyboard.

In order to measure absolute phase noise, an operator specifies the carrier frequency of the UUT, and indicates whether the signal to be measured is AM (amplitude modulated) or PM (phase modulated). This information is input to the controller via the keyboard, input program, or other input device. The controller automatically configures the receiver/downconverter to receive a 10 MHz IF. This 10 MHz signal is mixed with the PLL 10 MHz signal and a residual error frequency is measured on the digitizer. After correcting this residual error by automatically reprogramming the frequency difference to account for this error, AM or PM noise is measured. At this point, when the PLL and 10 MHz IF signals are identical in frequency, the phase locked PLL and 10 MHz IF signals are phase detected and the second phase shifter is rotated through zero crossings and peak amplitudes to establish the beat note amplitude and to establish a quadrature setting for PM or peak setting for AM. This determinant also provides the DC beat note level from the phase detector. If the measurement is being made on an AM (amplitude modulated) signal, then the peak signal value is stored as the beat note (PM signals will have a constant amplitude). The beat note represents the total RF power after phase detector conversion loss, which represents the signal level that the noise spectrum is referenced to. The controller then switches the output of the amplifier of the receiver/downconverter through to the spectrum analyzer. The power spectral density and spurious is then measured by the spectrum analyzer. Then, in order to establish true power spectral density, the controller applies 55 dB, 3 dB tangential, 3 dB single sideband, and 2.5 dB Filter/log Fidelity corrections to the measured noise power. Finally, the controller rechecks the quadrature (for PM measurement) or peak (for AM measurement) setting to ensure that quadrature or peak was not lost during the foregoing measurement.

In order to measure additive phase noise, an operator specifies the carrier frequency of the UUT, and indicates whether the signal to be measured is AM (amplitude modulated) or PM (phase modulated). This information is input to the controller via the keyboard, input program, or other input device. The controller automatically configures the receiver/downconverter to provide an additive phase noise measurement, and couples the output of the first phase shifter of the receiver downconverter to the digitizer. The controller then rotates the first phase shifter until quadrature is established and stores the phase snifter value. The output from the first phase shifter is then digitized by the digitizer and transmitted to the controller for processing. The controller processes the digitized data to determine the beat note of the UUT signal. If the measurement is being made on an AM (amplitude modulated) signal, then first phase shifter is rotated until peak is established, and the peak signal value is stored as the beat note (PM signals will have a constant amplitude). The controller then switches the output of the amplifier of the receiver/downconverter through to the spectrum analyzer. The power spectral density and spurious is then measured by the spectrum analyzer. Then, in order to establish true power spectral density, the controller applies 55 dB, 3 dB tangential, 3 dB single sideband, and 2.5 dB Filter/log Fidelity corrections to the measured phase power. Finally, the controller rechecks the quadrature or peak setting to insure that quadrature or peak was not lost during the foregoing measurement.

BRIEF DESCRIPTION OF THE DRAWINGS

The following drawings are illustrative of embodiments of the invention and are not meant to limit the scope of the invention as encompassed by the claims.

DETAILED DESCRIPTION OF THE PREFERRED EMBODIMENTS

Figure 1:
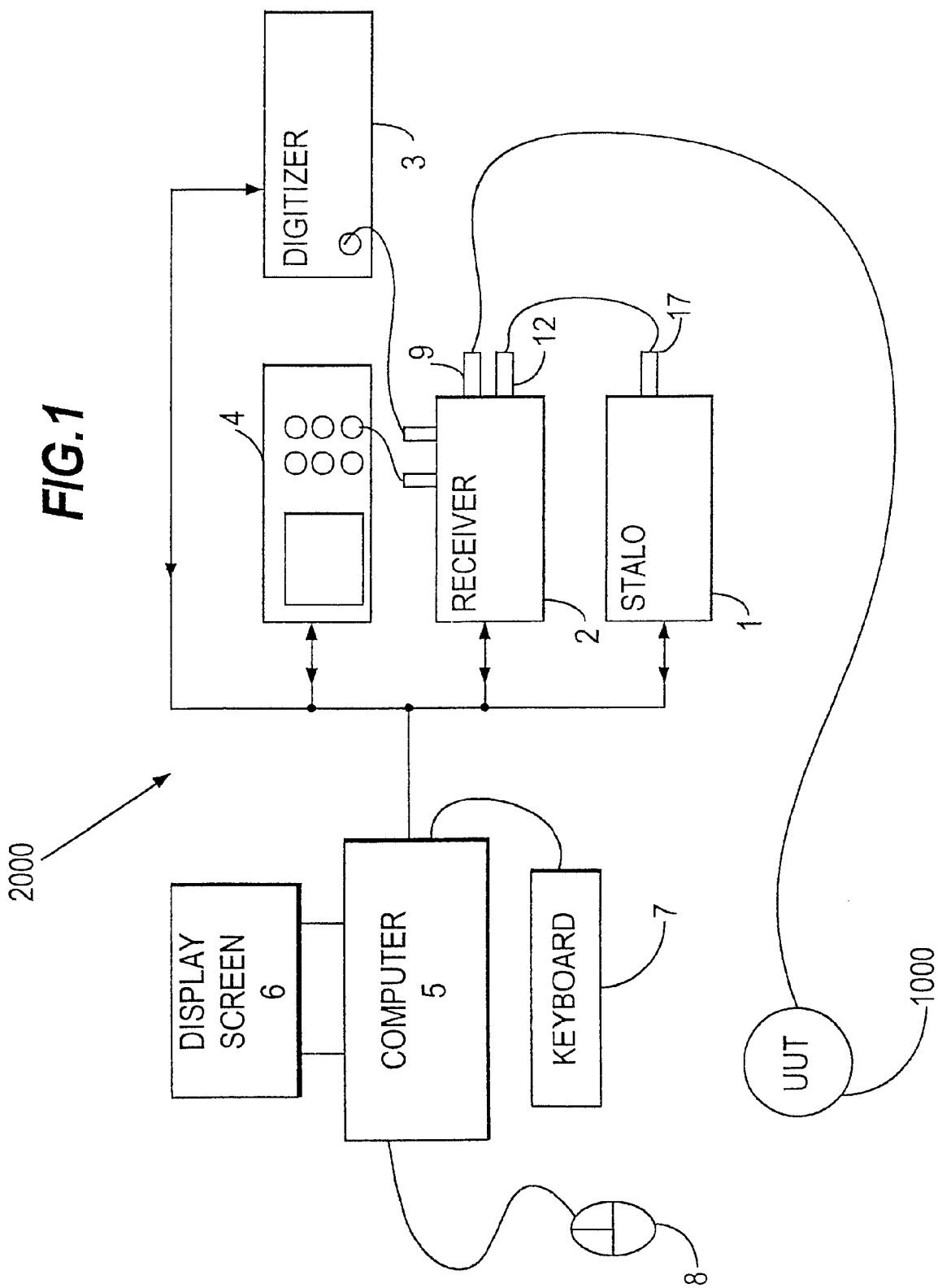
FIG. 1 shows a preferred embodiment of a phase noise measurement system in accordance with the present invention.

Referring to the accompanying drawings wherein like reference numerals refer to the same or similar elements, FIG. 1 shows a phase noise measurement system in accordance with an embodiment of the invention. A Unit Under Test (UUT) 1000 is coupled to a phase noise measurement system 2000 which includes a stable local oscillator synthesizer 1, a receiver/downconverter 2, a digitizer 3, a spectrum analyzer 4, and a computer 5 including a display screen 6, keyboard 7, and mouse 8.

Figure 2:
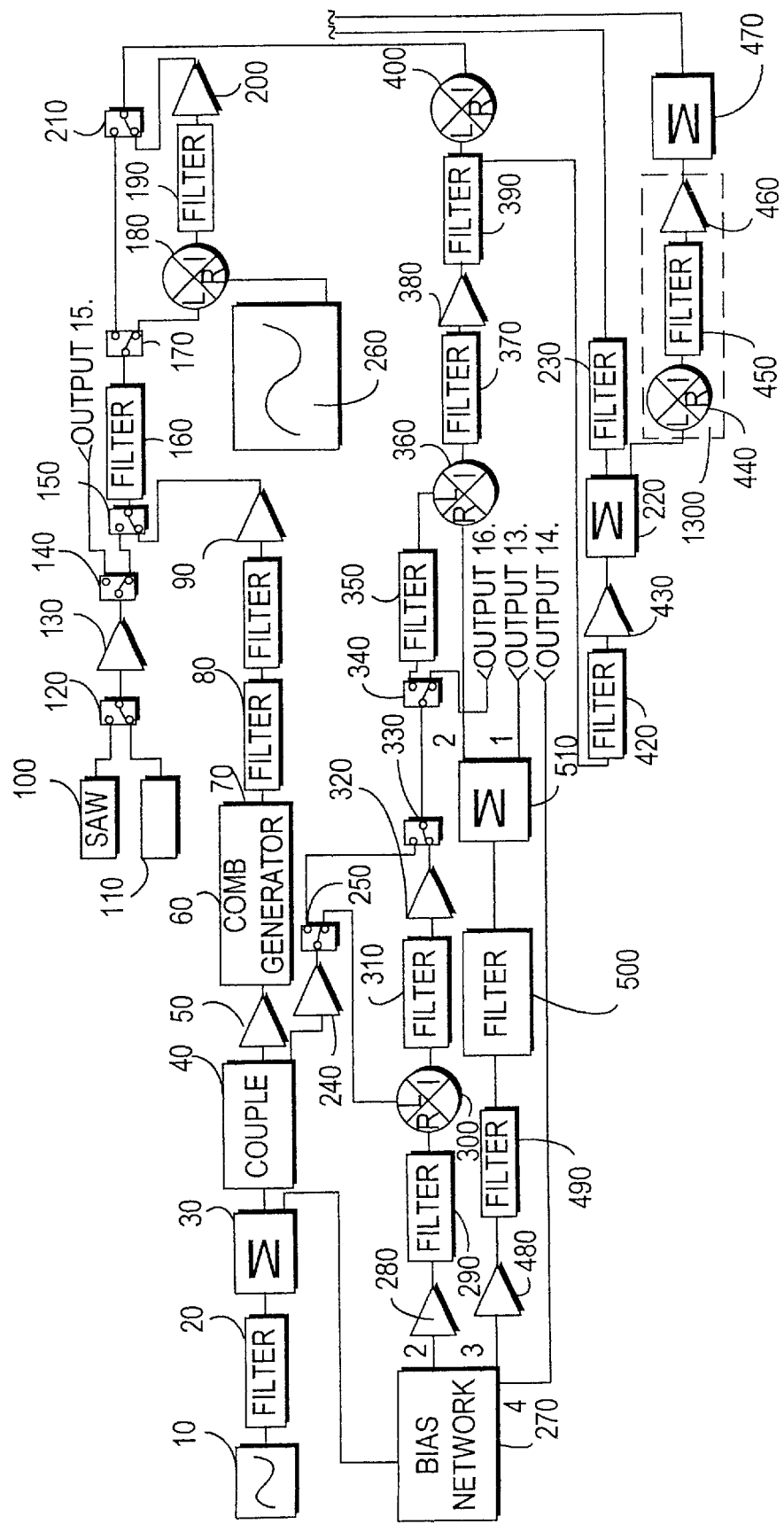
FIG. 2 shows a preferred embodiment of an stable local oscillator synthesizer in accordance with the present invention.

FIG. 2 shows the stable local oscillator synthesizer 1 (STALO) in more detail. The synthesizer is a programmable module which selectively produces L-Band signals and S-Band signals. In accordance with this embodiment, the L-Band signal can selectively provide a low noise signal "close in", e.g., within about 400 kHz of the output signal, or low noise far out, e.g., greater than about 400 kHz from the output signal. In accordance with this construction, a noise component of less than 100 dBc is achieved at 100 Hz, <120 dBc is achieved at 1 kHz, <130 dBc is achieved at 10 kHz, <140 dBc is achieved at 100 kHz, and <160 dBc is achieved at >=400 kHz. In accordance with this aspect of the invention, an oscillator 10 produces a 120 MHz reference signal which is multiplied by a comb generator 60 to produce a 960 MHz signal with low noise in the 960 MHz +/−400 kHz range to provide a low noise signal close in. In contrast, a SAW (surface acoustic wave oscillator) 100 is utilized to produce a 960 MHz signal with low noise at frequencies far out (i.e., >960.4 MHz, <959.6 MHz), but relatively high noise close in (i.e., 960 MHz +/−400 kHz).

Oscillator 10 produces a 120 MHz reference signal which is used to generate L-Band and S-Band reference signals for use in measuring the absolute phase noise of a UUT. The signal from the oscillator 10 is passed through a low pass filter 20 (150 MHz cutoff) to remove high frequency noise, and then through a power divider 30 which produces 120 MHz signals at each of its outputs 1 and 2. From output 1 of the power divider 30, the 120 MHz signal is input into a programmable bias network 270 having outputs 2, 3 and 4. The bias network 270 comprises a variety of amplifiers, dividers, and filters which are configured as known in the art to provide a programmable output of 10–40 MHz at output 2, a programmable output of 10–40 MHz at output 3, and a fixed output of 60 MHz at output 4. The outputs at 2 and 3 are then passed through respective amplifiers and 39 MHz low pass filters (280 & 290, 480 & 490) to provide respective programmable output signals of 10–39 MHz.

Figure 3:
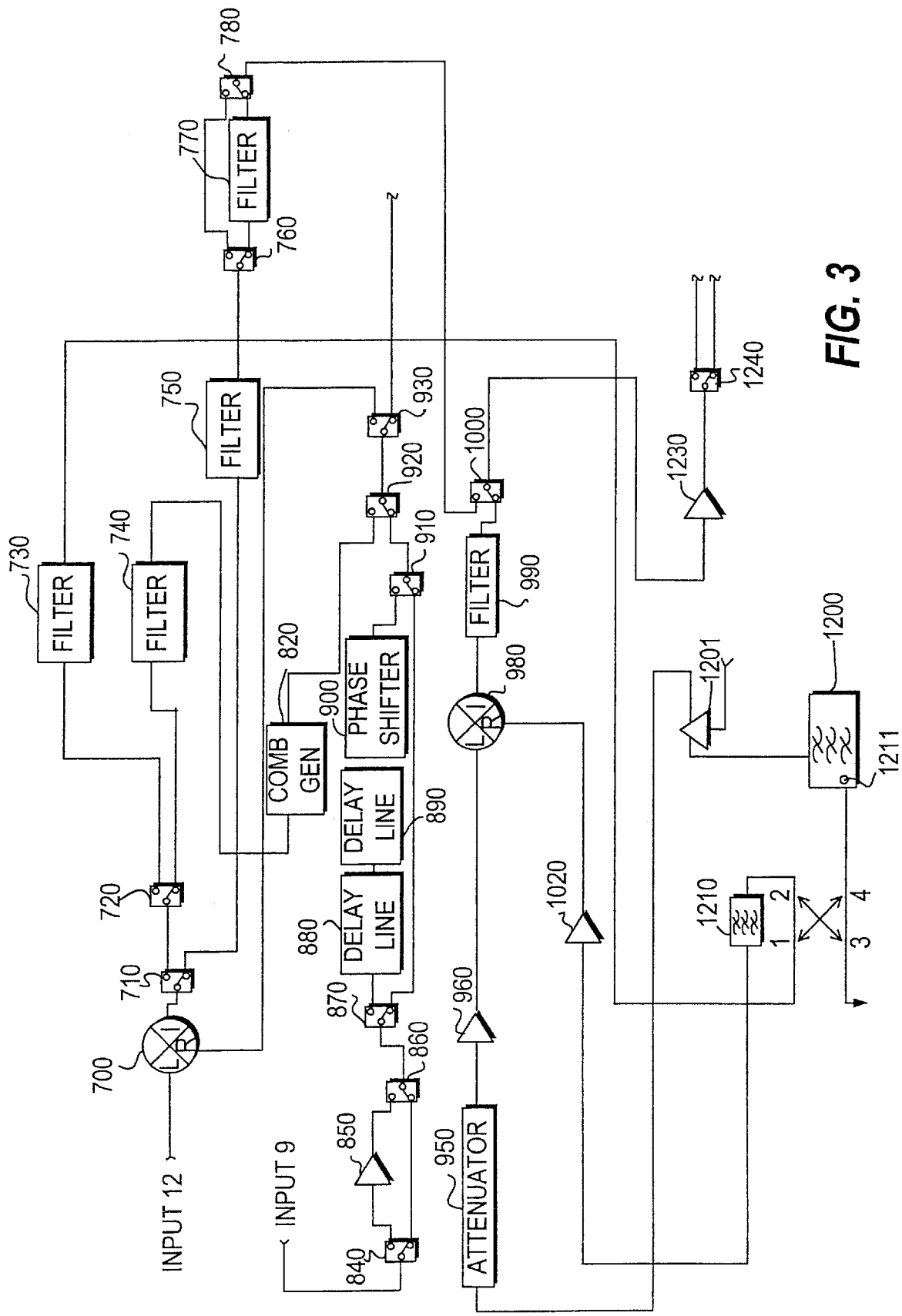
FIG. 3 shows a preferred embodiment of a receiver/downconverter in accordance with the present invention.

When the synthesizer 1 is programmed to produce an L-Band signal with low noise close in, the 120 MHz output of power divider 30 passes through directional couple 40 and into a comb generator 60. As one of ordinary skill in the art will appreciate, a comb generator produces a spectrum of signals which are multiples of the input frequency signal. Consequently, the output of the comb 60 will comprise a plurality of signals having frequencies equal to multiples of 120 MHz. Band pass filters 70, 80 isolate the 960 MHz signal portion of the comb generator 60 output, and pass it through switch 150 to low pass filter 160 (100 MHz) to remove high frequency noise. The 960 MHz signal then passes through switches 170 and 210 and into the L input of mixer 400. The programmable 10–39 MHz signal from output 3 of bias network 270 is passed through tunable bandpass filter 500 (which is tuned to the value of the signal from output 3) to remove low end and high end noise. The signal is then passed through power divider 510, whose output 2 is provided to the R input of mixer 360. Finally, the 120 MHz output of directional couple 40 passes through amplifier 240, switches 250, 330, 340, and low pass filter 350 (150 MHz) to provide a 120 MHz signal to the L input of mixer 360. The mixer 360 produces a sum signal (120+(10–30 MHz)) and a difference signal (120−(10–30 MHz)) at its output 1. Therefore, if, for example, the bias network 270 is programmed to provide an output of 10.2 MHz, then the signals available at the output of mixer M3 will be 109.8 MHz and 130.2 MHz. Either of these signals could be selected by tunable bandpass filter 370. Consequently, by properly programming the bias network 270, and the filters 370, 390, signals in the range from 90 MHz through 150 MHz may be selected for input into the R input of mixer 400 via tunable bandpass filter 370 (passband width of 200 kHz), amplifier 380, and low pass filter 390. The mixer 360 produces a sum signal ((90–150 MHz)+960 MHz) and a difference signal (960 MHz−(90–150 MHz)) at its output I. In this case, only the sum signal (1050 MHz to 1110 MHz) is passed through to the L-band Output via tunable Yig Filter 420, amplifier 430, power divider 220, and low pass filter 230. The use of the low noise 120 MHz oscillator multiplied by the comb generator to 960 MHz provides low signal noise within 400 kHz of the 960 MHz signal. However, due to the comb generator multiplication, the signal noise far out has been increased. In order to provide an increased L-Band range, the 960 MHz signal can be mixed at mixer 180 with the output of a 300 MHz oscillator 260 to create a 1260 MHz signal which, in turn, is applied to a 1260 MHz bandpass filter 190. In general, the amplifiers 50, 90, 200, 320 in the circuits of FIGS. 2 and 3 are provided to counteract gain losses caused by the other components, to provide better reverse isolation, and to provide gain to levels >+10 dBm for the L-Band output signals.

In order to produce an L-Band signal with low noise far out, a SAW oscillator (surface acoustic wave) 100 is utilized to produce a 960 MHz signal with low noise far out (more than 400 kHz from the carrier frequency). This 960 MHz signal is passed through switch 120, amplifier 130, switches 140 and 150, low pass filter 160, and switches 170, 210, and finally is fed into mixer 400. The remainder of the circuit operates in the manner described above for L-Band signal with low noise near in. A SAW 110 may be provided which produces a 1030 MHz signal in order to provide a greater L-Band range.

In order to produce an S-Band signal, the output of power divider 220 is fed into a tripler 1300 (including mixer 440, filter 450 and amplifier 460) which triples the L-Band signal into an S-Band signal. The bandpass filter 450 is set to pass only the 3 by 0 product output of the mixer.

The L-Band output of the synthesizer 1 is applied to receiver/down converter 2 at input 12. The output of the UUT I 000 is supplied to input 9 of the receiver/down converter 2. The Receiver/Down converter 2 can be used:

1) to perform absolute phase noise measurement of L Band and VHF by down converting the UUT signal to a 10 MHz IF signal, passing the 10 MHz IF signal through a PLL and phase shifter, rotating the phase shifter to establish quadrature (or peak for measurement) and passing the 10 MHz IF PLL input signal and the 10 MHz IF PLL output signal through a mixer to obtain a 0 MHz difference signal, and outputting the 0 MHz difference signal to the spectrum analyzer for an absolute phase noise measurement;

2) to perform additive phase noise measurement of S Band signals by passing an S-Band signal from the UUT through a delay line and phase shifter and into the R input of a mixer, applying an S-Band signal of equal carrier frequency from the synthesizer to the L input of the mixer, controlling the phase shifter to establish phase quadrature (or peak for AM measurement), isolating the 0 MHz difference output signal of the mixer with a 1.9 MHz low pass filter, and applying the filtered signal to the spectrum analyzer for an additive phase noise measurement;

3) to down convert and multiply the UUT signal to microwave frequencies which can be directly measured on a spectrum analyzer as a double side band signal by downconverting the UUT signal to a 100 MHz IF signal, multiplying the 100 MHz IF signal to microwave frequencies using a comb generator, and then outputting the multiplied signals to a spectrum analyzer for DMD phase noise measurement.

The manner in which an absolute phase noise measurement is made will now be described with reference to FIGS. 3 and 4.

In order to perform an absolute phase noise measurement for an L-Band signal, a technician will connect the UUT output to input 9 and connect the synthesizer 1 L-Band output 17 to input 12 of receiver 2 (step 5010) and will specify 1) whether the absolute phase noise measurement will be for AM (amplitude modulation) or PM (phase modulation) absolute; and 2) the frequency of the UUT signal. This information is input to the computers via keyboard 7.

Once this information has been input, the computer 5 will set the synthesizer 1 to output a signal which is 10 MHz higher (or lower) than the specified UUT signal frequency. In the receiver 2, the UUT signal will pass from input 9 through switches 840 (optionally amplifier 850), 860, 870, 910, 920, and 930 into the R input of mixer 700. The L-Band signal from the synthesizer 1, which is offset 10 MHz from the UUT signal, is applied to the L input of mixer 700. The output I of the mixer 700 then passed through switches 710, 720 and into 10 MHz bandpass filter 730. In this manner, the UUT signal has been down converted to a 10 MHz IF signal.

The downconverted 10 MHz IF signal is simultaneously applied to (a) PLL 1200 which includes a VCXO oscillator 1211 and to (b) amplifier 1020 and the R input of mixer 980, such that the 10 MHz VCXO signal of the VCXO oscillator 1211 will phase lock to the signal applied to the PLL 1200 at whatever phase stabilizes the loop. This VCXO signal is decoupled and applied to a phase shifter 1201 and then through attenuator 950, amplifier 960, and into the L input of mixer 980. In this regard, attenuator 950 reduces the signal gain to within the dynamic range of amplifier 960. The digitizer is coupled to J12 of switch 1240 and the phase shifter is rotated through 180 degrees in order to establish peak (for AM), or quadrature (for PM) and the beat note of the canceled signal is measured (any noise measured is PM or AM noise). In this manner, the 10 MHz down converted UUT signal has been canceled, leaving signal noise in the range of 1 Hz to 1.9 MHz at the output of the filter 990. The noise signal is then passed through switch 1000 and into a low noise amplifier 1230 which provides a programmable gain of 45 to 50 dB). The low noise programmable amplifier 1230 is then programmed (nominal >50 dB gain) and the noise signal is applied to the spectrum analyzer from output J11 of switch 1240. Since the amplifier 1230 has an effective range of from 75 Hz to 5 MHz, it will not adversely affect the noise signal. The gain provided by the amplifier 1230 is used to increase the noise signal by a known factor (without significant distortion) so that the noise signal is in the effective range of the spectrum analyzer. Power spectral density is then evaluated from 100 Hz to 2 MHz and the data is automatically evaluated and plotted for additional operational evaluation.

Figure 4:
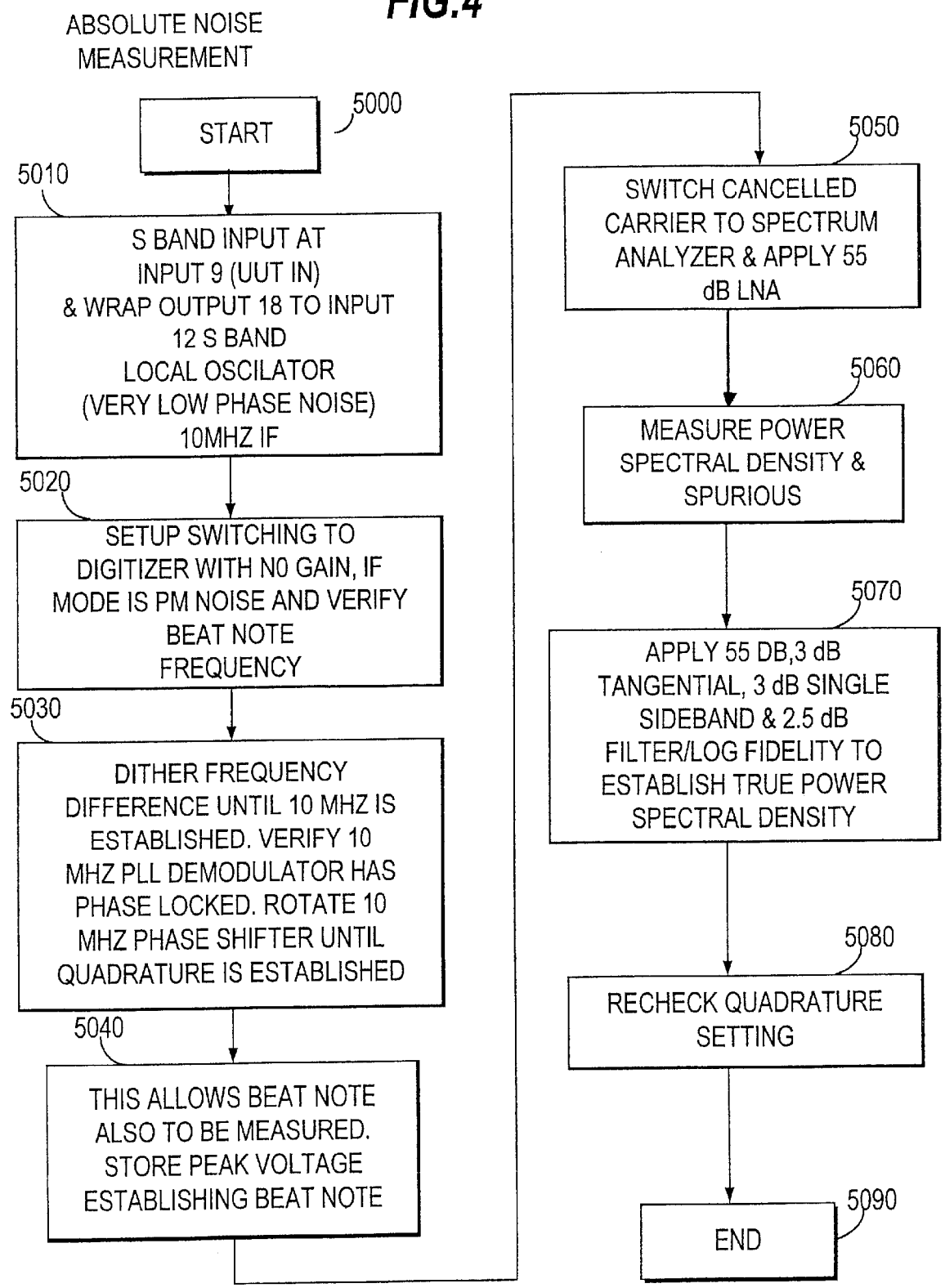
FIG. 4 shows a preferred embodiment of a flowchart for performing an absolute phase noise measurement in accordance with the present invention.

Referring to FIG. 4, in order to measure the absolute phase noise, once the operator has verified that the PLL is phase locked, the phase shifter 1201 is rotated as set forth above until quadrature (for PM measurement) or peak (for AM measurement) is established between the output signal at J4 and the input signal at J2 (FIG. 4, step 5030) Once quadrature is established for PM measurement, the beat note is measured on the digitizer (FIG. 4, step 5040). If the measurement is being made on an AM (amplitude modulated) signal, then the peak signal value is stored as the beat note (PM signals will have a constant amplitude). The beat note represents the total RF power after phase detector conversion loss which represents the signal level that the noise spectrum is referenced to. The output of amplifier 1230 is then switched through to the spectrum analyzer via switch 1240 (FIG. 4, step 5050). The power spectral density and spurious is then measured by the spectrum analyzer (FIG. 4, step 5060). Then, in order to establish true power spectral density, 55 dB, 3 dB tangential, 3 dB single sideband, and 2.5 dB Filter/log Fidelity is applied as set forth in the flow chart of FIG. 4 (step 5070). Finally, the quadrature setting (for PM measurement) or peak setting (for AM measurement) is rechecked to insure that the setting was not lost during the foregoing measurement (FIG. 4, step 5080).

Figure 5:
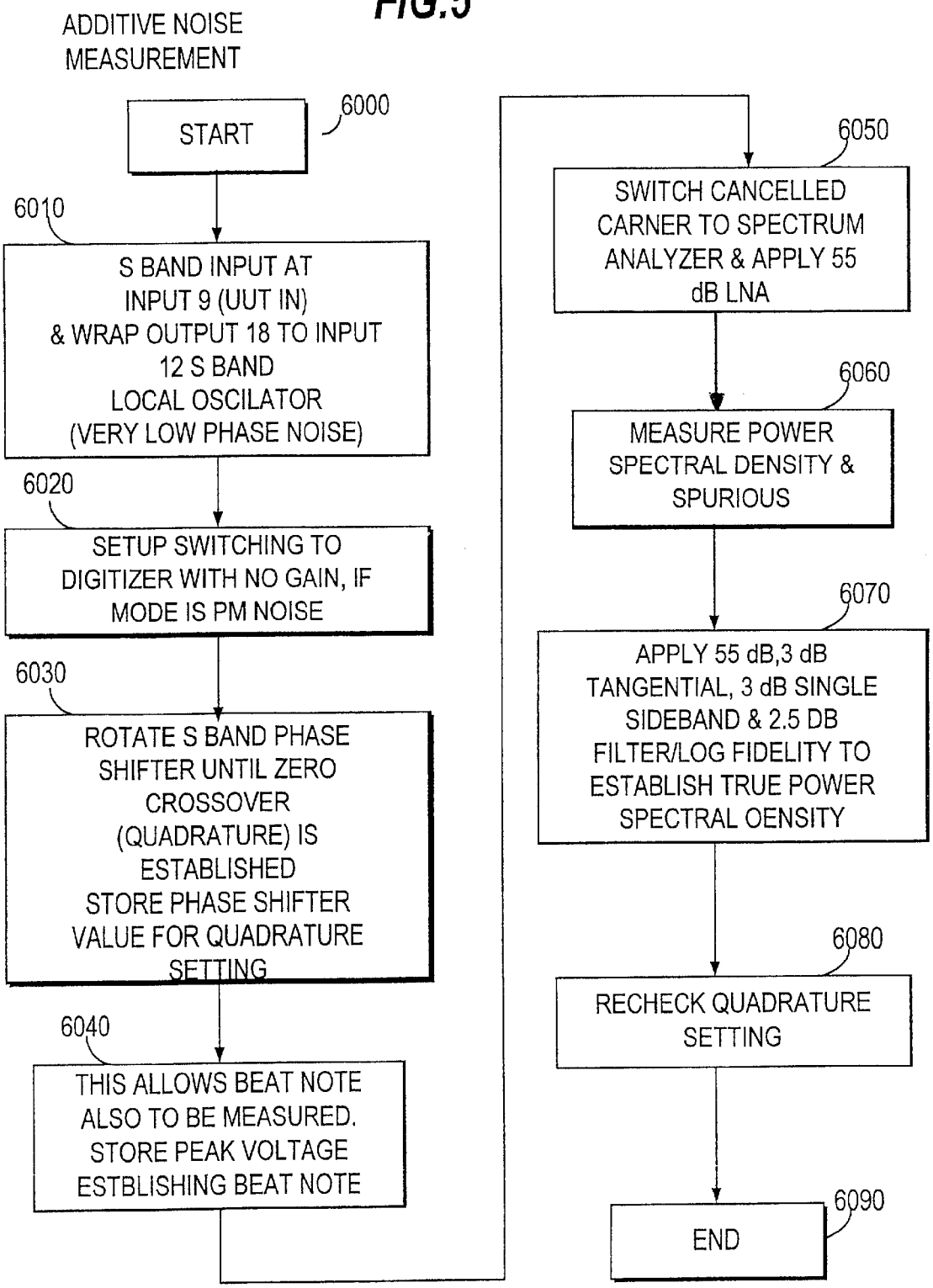
FIG. 5 shows a preferred embodiment of a flowchart for performing an additive phase noise measurement in accordance with the present invention.

Referring to FIGS. 3–5, in order to perform an additive phase noise measurement, the S-band output of the synthesizer is coupled to input 12 of the receiver 2, and the S-band output of the UUT is applied to the input 9 of the receiver 2 (FIG. 5, step 6010). The signal input at input 9 passes through switch 840 (optionally amplifier 850), switch 860, 870, and then through delay lines 880, 890, (40 nanoseconds) through phase shifter 900, switches 910, 920, 930 and then into the R input of mixer 700. Mixer 700 mixes the S-band output of synthesizer 1 with the delayed version of the S-band UUT signal, producing a difference output of 0 MHz at the output of the mixer, which is isolated by 1.9 MHz low pass filter 750, passed through switches 760, 780 (and optionally filter 770), switch 1000, low noise amplifier 1230, and then output through switch 1240 to either a digitizer or the spectrum analyzer. Delay lines 880, 890 serve to reduce the synthesizer phase noise when the phase shifter maintains quadrature between the inputs to the mixer 700 so that the synthesizer phase noise rise is low enough to ensure additive phase noise sensitivity.

Referring to FIG. 5, in order to measure the additive phase noise, the output of the mixer 700 is coupled through the amplifier 1230 and is switched to the digitizer via switch 1240 for PM measurement. The phase shifter 900 is rotated until quadrature is established with the S-Band output of the synthesizer (steps 6020, 6030). The phase shifter value is then stored, and the beat note is measured by the digitizer. It should be noted that although the frequency signal is canceled, a dc output still exists which is proportional to phase difference between input signals at the mixer 700 phase detector. Therefore, as the phase shifter 700 is rotated, the peak to peak signal level is determined and is used to evaluate beat note and to establish the quadrature versus peak phase shifter setting. The beat note represents the total RF power after phase detector conversion loss which represents the signal level that the noise spectrum is referenced to. The output of amplifier 1230 is then switched through to the spectrum analyzer via switch 1240 (step 6050). The power spectral density and spurious is then measured by the spectrum analyzer (step 6060). Then, in order to establish true power spectral density, 55 dB, 3 dB tangential, 3 dB single sideband, and 2.5 dB Filter/log Fidelity is applied as set forth in step 6070. Finally, the quadrature setting is rechecked to insure that quadrature was not lost during the foregoing measurement (step 6080).

If the measurement is being made on an AM (amplitude modulated) signal, the same procedure is followed except that the phase shifter 1201 is rotated until peak is established, and the peak signal value is stored as the beat note (step 6040).

In certain applications, the UUT 1000 produces its S-Band signal by passing its L-Band signal through a UUT tripler (not shown). In such applications, the UUT tripler can be separately tested in the following manner. First, the S-band output of the synthesizer is coupled to input 12 of the receiver 2, and the S-band output of the UUT is applied to the input 9 of the receiver 2. Additive phase noise measurement is then performed in the same manner described above. Since both the UUT signal and the synthesizer signal originate from the L-Band output of the synthesizer, the resulting noise measurement can be compared to the known noise of the synthesizer 1 to determine the noise which has been added by the ULTT tripler.

The noise of the synthesizer 1 is measured during a calibration procedure by applying output 1 of power divider 470 of synthesizer 1 to input 12 of the receiver 2, applying output 2 of the power divider 470 to input 9 of the receiver, and following the procedures for additive phase noise measurement described above. In this manner, the receiver 2 mixes the S-band output of synthesizer 1 with a delayed version of itself in order to produce an output signal comprising the noise of the synthesizer 1. This noise can then be subtracted from the total noise measured during the additive phase noise measurements described above in order to determine the noise added by the UUT and/or UUT tripler respectively.

Figure 6:
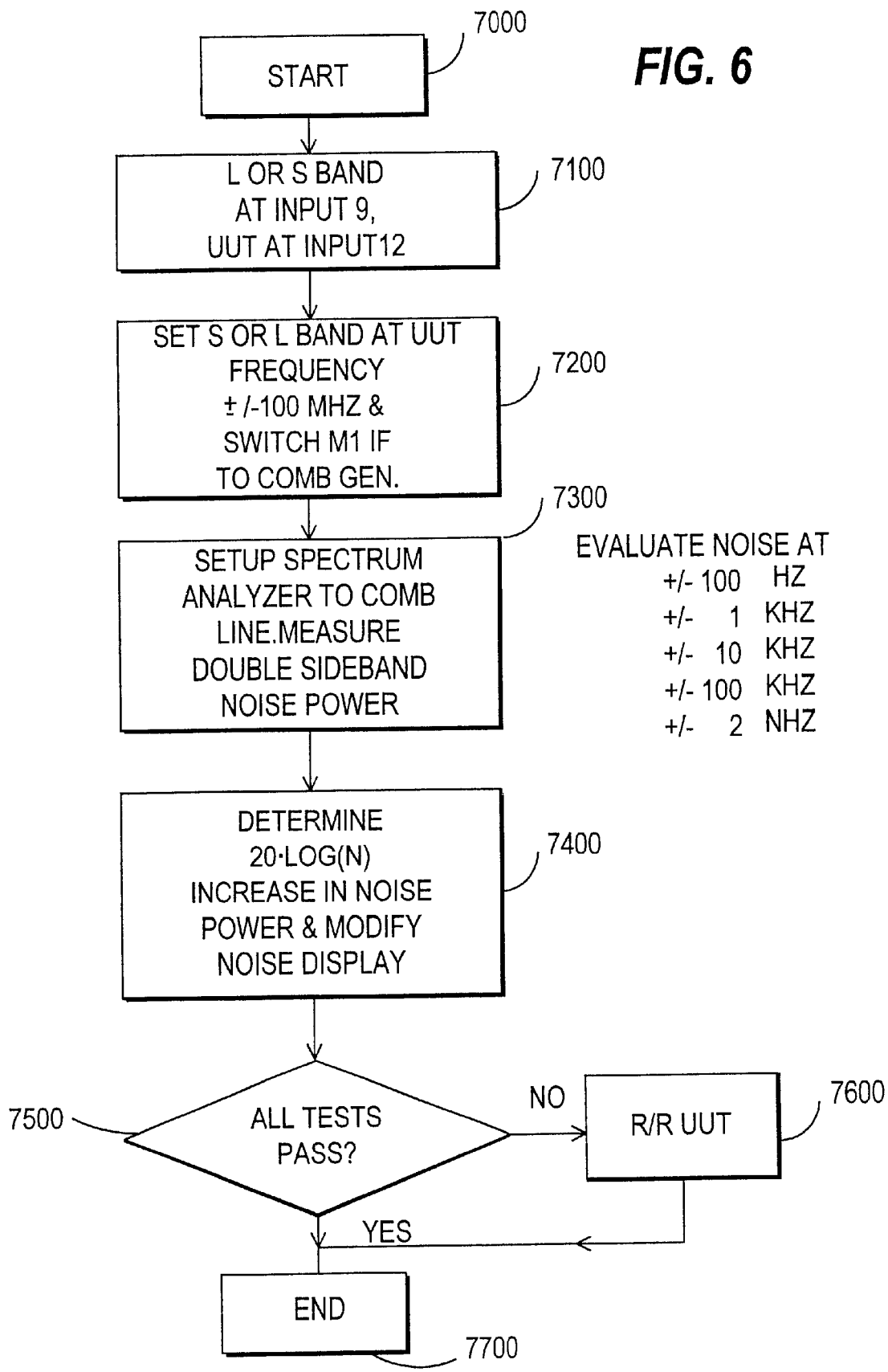
FIG. 6 shows a preferred embodiment of a flow chart for DMD phase noise measurement in accordance with the present invention.

The procedure for the DMD direct measurement technique will now be explained with reference to FIG. 6. In this mode, the synthesizer 1 is programmed to produce a signal which is 100 MHz offset (higher or lower) from the expected UUT signal. The synthesizer output is applied to input 9 of the receiver 2 and the UUT output is applied to input 12 of the receiver (step 7106). The UUT signal at input 12 passes through switches 840, 860, 870, 910, 920 and into the R input of mixer 700. Mixer 700 mixes the UUT signal (at the R input) with the 100 MHz offset signal from synthesizer 1 (at the L input) to create a 100 MHz IF signal at output I of mixer 700. The 100 MHz IF signal is passed through 100 MHz bandpass filter 740, through switch 810 and into comb generator 820 (step 7200). As explained above, a comb generator generates a series of pulse bands which have frequencies equal to multiple of the input signal. Therefore the comb generator 820 produces output signals at 100 MHz, 200 MHz, 300 MHz, . . . , 1.0 GHz, 1.1 GHz, . . . et al. This signal goes directly out to the spectrum analyzer for noise measurement as a double side band signal. The operator can then choose which picket he wishes to work with. Preferably, the operator will choose a picket in the 4–6 GHz range because this is in the most effective range of the spectrum analyzer. In any case, the operator sets up the spectrum analyzer to measure a preselected comb frequency, and the double-sideband noise power is measured at +/−100 Hz, +/−1 kHz, +/−10 kHz, +/−100 kHz, +/−2 MHz (step 7300). The above procedure results in a 20 Log N increase in noise power (i.e., the noise received by the spectrum analyzer is 20 Log N times the actual UUT noise).where N is the selected comb frequency. Thus, in step 7400, the 20 Log N increase is determined, and the noise display on the spectrum analyzer is modified to reflect the actual UUT noise. At step 7500, the system determines whether all tests have passed, i.e., whether the noise measured in the absolute phase noise measurement, the additive phase noise measurement, and DMD phase noise measurement is within a predetermined range. If all tests have not been passed, the operator is instructed to replace and repair (R/R) the UUT (step 760).

It will be understood that numerous modifications and substitution can be made to the above-described embodiments without deviating from the scope and spirit of the invention. For example, the techniques and associated circuitry described above have been incorporated in another design covering frequencies from 3 GHz to 4.5 GHz and 7 GHz to 10.5 GHz. Accordingly, the above-described embodiments are intended for the purpose of illustration and not as limitation.

What is claimed is:

1. A method for measuring absolute, DMD and additive phase noise using a low noise synthesizer, comprising the steps of:

providing a receiver/downconverter including a UUT input and an output, selectively coupling the UUT input to an input of a first phase shifter for additive phase noise measurement, passing a signal from the low noise synthesizer to a first mixer, selectively coupling the first mixer to the UUT input for absolute phase noise measurement and DMD phase noise measurement and to an output of the first phase shifter for additive phase noise measurement, selectively coupling an output of the first mixer to a first bandpass filter for absolute phase noise measurement, to a second bandpass filter for DMD phase noise measurement and to a first low pass filter for additive phase noise measurement, passing a signal from the first bandpass filter to a second mixer and to a phase locked loop coupled to a second phase shifter, passing a signal from the second phase shifter to the second mixer, passing a signal from the second mixer to a second low pass filter, passing a signal from the second bandpass filter to a first comb generator, and selectively coupling outputs of the first low pass filter, the second low pass filter and the first comb generator, to the output of the receiver/downconverter.

2. The method of claim 1, further comprising the step of:
selectively generating L-Band and S-Band signals by means of the low noise synthesizer.

3. The method of claim 1, further comprising the step of:
providing control means for selectively coupling the UUT input to the input of the first phase shifter for additive phase noise measurement, selectively coupling the second input of the first mixer to the UUT input for absolute phase noise measurement and DMD phase noise measurement and to the output of the first phase shifter for additive phase noise measurement, selectively coupling the output of the first mixer to the first bandpass filter for absolute phase noise measurement, to the second bandpass filter for DMD phase noise measurement and to the first low pass filter for additive phase noise measurement, and selectively coupling outputs of the first low pass filter, the second low pass filter and the comb generator, to the output of the receiver/downconverter.

4. The method of claim 3 wherein said control means comprise a controller coupled to the receiver/downconverter.

5. The method of claim 1, further comprising the steps of:
selectively producing a signal having a first frequency by means of a low noise crystal first oscillator and a signal having a second frequency by means of a surface acoustic wave oscillator,
passing the signal having a first frequency to a second comb generator,
passing a signal from the second comb generator to a third bandpass filter having a passband which includes the second frequency,
passing the signal from the first oscillator to a frequency dividing component,
controlling the frequency dividing component to selectively produce a signal having one of a plurality of offset frequencies, each of the plurality of offset frequencies being in a first frequency range,
passing the signal having the one of the plurality of offset frequencies from the frequency dividing component to a third mixer,
selectively passing the output of the second oscillator and the output of the third bandpass filter to the third mixer,
passing a mixed signal from the third mixer to a tunable bandpass filter, and
selectively tuning the tunable bandpass filter to a passband which includes a sum or a difference of the selected offset frequency and the second frequency.

6. The method of claim 5, wherein the tunable bandpass filter is tuned to a passband which includes a sum of the selected offset frequency and the second frequency.

7. The method of claim 5, wherein the tunable bandpass filter is tuned to a passband which includes a difference of the selected offset frequency and the second frequency.

8. The method of claim 5, further comprising the step of:
selecting the first frequency in a range from 10 MHz to 40 MHz.

9. A method for measuring phase noise, comprising the steps of:
selectively producing a signal having a first frequency by means of a first low noise crystal oscillator or a signal having a second frequency by means of a second surface acoustic wave oscillator,
passing the signal having a first frequency to a comb generator,
passing a signal from the comb generator to a bandpass filter having a passband which includes the second frequency,
passing the signal from the first oscillator to a frequency dividing component,
controlling the frequency dividing component to selectively produce a signal having one of a plurality of offset frequencies, each of the plurality of offset frequencies being in a first frequency range,
passing the signal having the one of the plurality of offset frequencies from the frequency dividing component to a mixer,
passing the output of the second oscillator and the output of the bandpass filter to the mixer,
passing a mixed signal from the mixer to a tunable bandpass filter,
selectively tuning the tunable bandpass filter to a passband which includes a sum or a difference of the selected offset frequency and the second frequency, and
passing the signal from the tunable bandpass filter and a signal from a UUT to a receiver/downconverter which measures the phase noise of the UUT signal.

10. The method of claim 9, further comprising the step of:
selecting the first frequency in a range from 10 MHz to 40 MHz.

11. The method of claim 9, wherein the tunable bandpass filter is tuned to a passband which includes a sum of the selected offset frequency and the second frequency.

12. The method of claim 9, wherein the tunable bandpass filter is tuned to a passband which includes a difference of the selected offset frequency and the second frequency.

13. The method of claim 9, wherein the second frequency is 960 MHz.

14. The method of claim 9, wherein the first frequency is 120 MHz.

15. The method of claim 9, wherein the passband of the bandpass filter is centered at 960 MHz.

* * * * *